US008966758B1

(12) United States Patent
McReynolds

(10) Patent No.: US 8,966,758 B1
(45) Date of Patent: Mar. 3, 2015

(54) SYSTEM AND METHOD OF PRODUCING SCALABLE HEAT-SINK ASSEMBLY

(76) Inventor: Jeffrey Skaggs McReynolds, Plano, TX (US)

( * ) Notice: Subject to any disclaimer, the term of this patent is extended or adjusted under 35 U.S.C. 154(b) by 488 days.

(21) Appl. No.: 12/807,963

(22) Filed: Sep. 17, 2010

(51) Int. Cl.
*H05K 7/20* (2006.01)

(52) U.S. Cl.
USPC ............. 29/890.03; 29/890.039; 165/80.2; 165/80.4

(58) Field of Classification Search
CPC ... B23P 15/26; F28F 2275/00; F28F 2275/10; F28F 2275/12; F28F 2275/14; F28F 2275/16
USPC ......... 29/890.03, 890.039, 890.052; 165/185, 165/80.2, 80.3, 80.4
See application file for complete search history.

(56) References Cited

U.S. PATENT DOCUMENTS

| 4,022,272 | A  | * | 5/1977 | Miller ......................... 165/51 |
| 8,498,116 | B2 | * | 7/2013 | Siracki ....................... 361/710 |
| 2001/0024100 | A1 | * | 9/2001 | Shinnaka .................... 318/701 |

* cited by examiner

*Primary Examiner* — Christopher Besler
(74) *Attorney, Agent, or Firm* — Jeffrey Roddy

(57) ABSTRACT

A system for producing heat-sink assemblies in which a series of extruded members possess mating faces, each face having an alternating series of troughs and bulbous-shaped ridges which are formed from the sides of the troughs. Mating ridges of one face of each extruded member are dipped with a thermally conductive compound prior to press-fitting and at least some of the ridges and troughs possess a groove that when mated to an opposing region of an adjacent extruded member produces a reservoir that serves as a feeder source for thermally conductive compound. Once the extruded members are press fitted, portions of the bulbous-shaped ridges on one face are forced past portions of the bulbous-shaped ridges of the opposing face and into the troughs. Deformation of the bulbous-shaped ridges is uniformly expansive so as to reduce shearing relative to the surfaces of the troughs, and the formed reservoirs are further compressed and feed thermal compound into the interstices between mating members.

2 Claims, 4 Drawing Sheets

SYSTEM AND METHOD OF PRODUCING SCALABLE HEAT-SINK ASSEMBLY

CROSS REFERENCE TO RELATED APPLICATIONS

Not Applicable

STATEMENT REGARDING FEDERALLY SPONSORED RESEARCH OR DEVELOPMENT

Not applicable

THE NAMES OF THE PARTIES TO A JOINT RESEARCH AGREEMENT

Not applicable

INCORPORATION-BY-REFERENCE OF MATERIAL SUBMITTED ON A COMPACT DISC

Not applicable

FIELD OF THE INVENTION

The present invention relates generally to heat-sinks, and more particularly to heat-sink assemblies constructed from press-fitted sub-units.

BACKGROUND OF THE INVENTION

A heat-sink is an object that transfers thermal energy from a higher temperature to a lower temperature fluid medium. Heat-sinks used for the cooling of electronic components are typically constructed from thermally conductive materials such as aluminum alloys and generally possess a base portion of relatively thicker material and a region having a plurality of fins or posts, designed to maximize the surface area of the heat-sink exposed to the air or other fluid medium having a temperature lower than that of the heat-sink. The base portion is in close contact with a heat producing element such as a CPU or other heat producing electrical components, and the fins disperse the conducted heat to the surrounding fluid medium.

Heat-sinks are conventionally manufactured by extruding, machining, pressure die-casting, or some combination of the foregoing processes.

Size of finned heat-sinks varies greatly depending on the application and range; from types used for graphic card memory of typically a 1 $cm^2$ base size, to units having contact areas of >1000 $cm^2$. Because the variety of electrical components that require cooling is virtually endless and the pace of innovation so rapid, many heat-sinks are custom produced for the particular application which increases the cost to manufacture, and invariably raises the price to the consumer.

At least one interlocking heat-sink assembly is known in the art which teaches a heat-sink formed of pre-cut and press-fitted strip elements to form an interlocking stack permitting the heat-sinks to readily scale. When press-fitting sub-units to form larger assemblies, the press-fitted sub-units are often subject to excessive shear forces causing unwanted deformation, deflection, structural failure and voids. Any gap between press-fitted elements necessarily reduces conduction across the heat-sink and impairs the heat-sink's ability to transfer heat to the fluid medium.

Although a scalable press-fit heat-sink assembly performing substantially as well as one conventionally produced would be desirable for many reasons, e.g., reduced time to manufacture, the production of such an assembly has heretofore been problematic.

SUMMARY OF THE INVENTION

The present invention is a system for assembling of a heat-sink and more particularly a system in which the heat-sink assembly is constructed from individual extruded members which are press-fitted together to form various sized assemblies. Even more particularly, the extruded members have opposing faces that are partially coated with a thermally conductive compound, such as a thermal epoxy, prior to a press-fit operation. Each opposing face possesses an alternating series of troughs and ridges, with the ridges having a generally bulbous shape. At least some of the ridges and troughs possess a longitudinal groove or recess that performs as a feeder reservoir for the thermally conductive compound during the press-fitting. During a press-fitting, while the direction and progress of the plastic deformation of the mating portions vary over time, the bulbous shapes have the tendency to deform in a direction generally perpendicular to the inner surfaces of mating troughs resulting in reduced shearing between the mating surfaces. Reduced shearing prevents portions of the mating surfaces from scraping against each other during the progressive deformation which would otherwise result in the leading regions scraping the thermally conductive compound forward of the trailing regions, leading to voids. Transversely applied compressive force to the mated assembly produces a relatively uniform expansive deformation of the ridges into the troughs, with the distance between opposing sections of the troughs narrowing to meet the neck portion of the bulbous regions. The rounded profiles of the ridges and troughs reduce shear during press-fitting and evenly distributes the thermally conductive compound throughout the spaces between the individual sub-units. Absence of voids within the thermally conductive compound improves the overall thermal conductivity of the heat-sink assembly and means that application of thermal compound and press-fitting can be performed in one operation.

In one aspect of the present invention, at least some of the bulbous shaped protrusions possess a groove that serves as a reservoir for the thermally conductive substance during press-fit operations.

In another aspect of the present invention, in certain regions where a bulbous shape is mate-ably engaged with a trough, the reservoir of the bulbous shape faces a reservoir of a trough portion and together form a longitudinal aperture that serves to feed additional thermally conductive compound to surrounding mating surfaces during the press-fit operation.

One object of the present invention is to provide a means for manufacturing a custom sized heat-sink from a number sub-units of uniform shape.

Another object of the present invention is to provide a press-fit assembly constructed of extruded members with a layer of thermally conductive compound between the individual members.

Still another object of the present invention is reduce the time it takes to produce a custom sized heat-sink.

Yet another object of the present invention is to a geometry for the heat-sink assembly producing under compression, a uniform distribution of a thermally conductive compound in the interstices of the assembly.

The description as follows is not intended to limit the scope of the invention to the particular forms set forth, but on the contrary, it is intended to cover such alternatives, modifica-

DETAILED DESCRIPTION OF THE INVENTION

Figure 1:
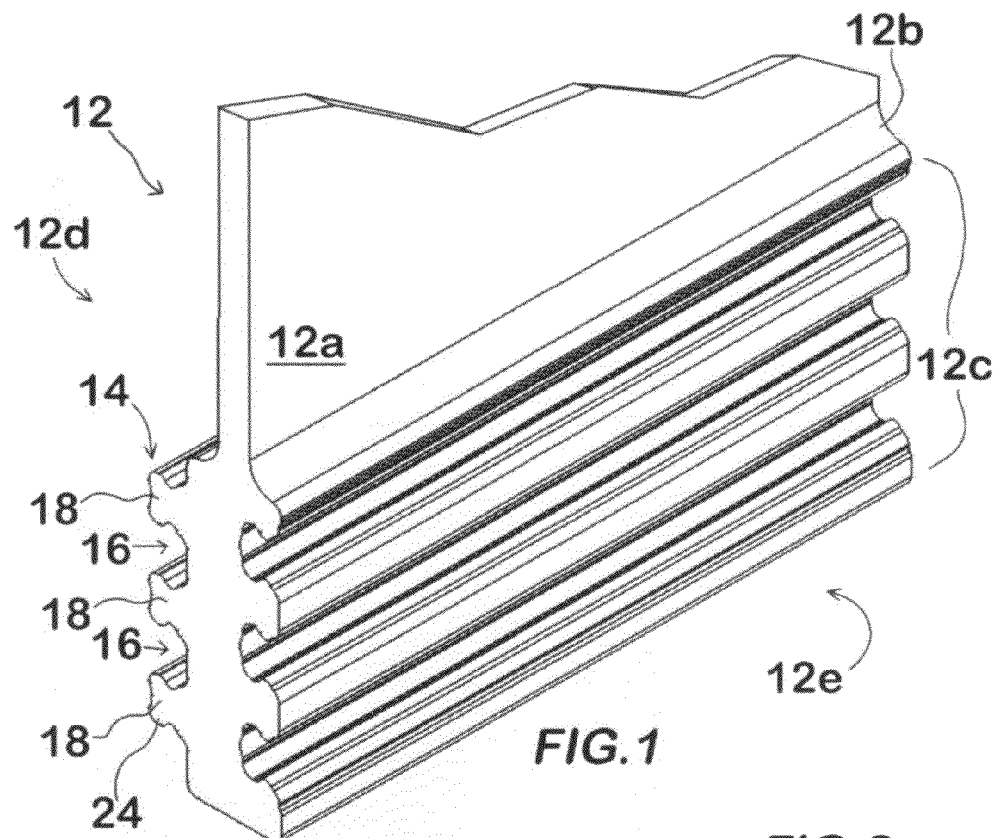
FIG. 1 is a partial perspective view according to one embodiment of the present invention primarily depicting one face 12e of an extruded member.

REFERENCE LISTING 12 extruded member
12a top portion extruded member
12b middle portion extruded member
12c bottom portion extruded member
12d first face of extruded member
12e second face of extruded member
14 ridge
16 trough
18 bulbous formation
20 head portion
22 neck portion
24 knob
26 base of trough
28a groove
28b groove
29 reservoir
30 interstices
32 thermally conductive compound Referring generally to FIGS. 1-9; a system for producing scalable heat-sink assemblies includes, at least two extruded members 12, logically divided into a top portion 12a extending to a fin, a middle portion 12b where the fin transitions to a shoulder, a bottom portion 12c having two faces 12d and 12e that each posses a number of alternating ridges 14 and troughs 16 in which the ridges have a generally bulbous 18 shape which is further logically subdivided into a head portion 20 possessing two knob 24 portions. According to one embodiment, at least some ridges 14 possess a groove 28a at the crown of the head portion 20, while some troughs possess a groove 28b in the base 26 of the trough.

In the particular embodiment depicted there are typically two ridge profiles, one type, found on a first side 12d of the extruded member 12, has a groove, while the other ridge located along a second side 12e of the extruded member lacks the groove. Likewise, there are typically two trough profiles, one type lacking a groove, found on the first side 12d, and another type located along the second side 12e having a groove 28b. After press-fitting together, the first and second sides of the extruded profiles interconnect with one another via the head portions 20 of the grooved ridges along face 12d mate-ably engaged with the neck portions 22 of the non-grooved ridges along face 12e, and the head portions of the non-grooved ridges along face 12e mate-ably engaged with the neck portions of the grooved ridges along 12d. The grooves 28a of the ridges and the grooves 28b of the troughs face one another and together form sinuses 29 defining a reservoir, which is produced by the two relatively shallow arcuate surfaces in mirrored opposition.

Figure 2:
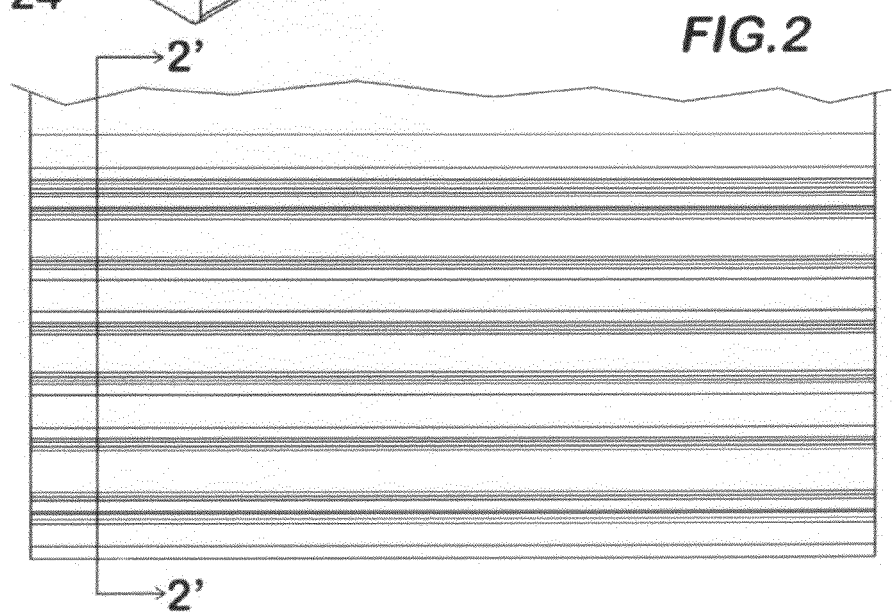
FIG. 2 is a plan view according to the present invention of face 12e of an extruded member.
Figure 3:
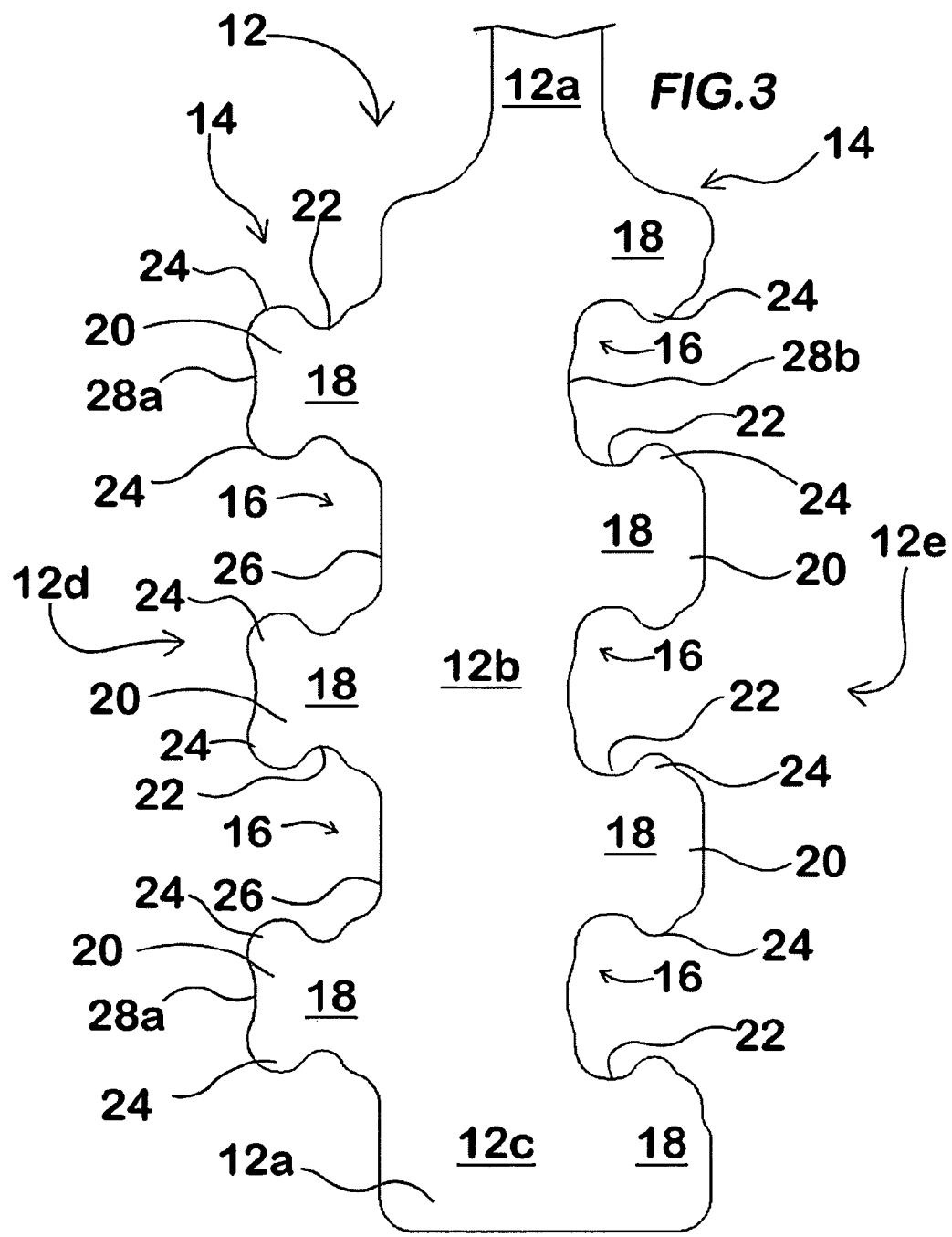
FIG. 3 is cross-sectional view taken along lines 2'-2' of FIG. 2 depicting the respective profiles of faces 12d and 12e.
Figure 4:
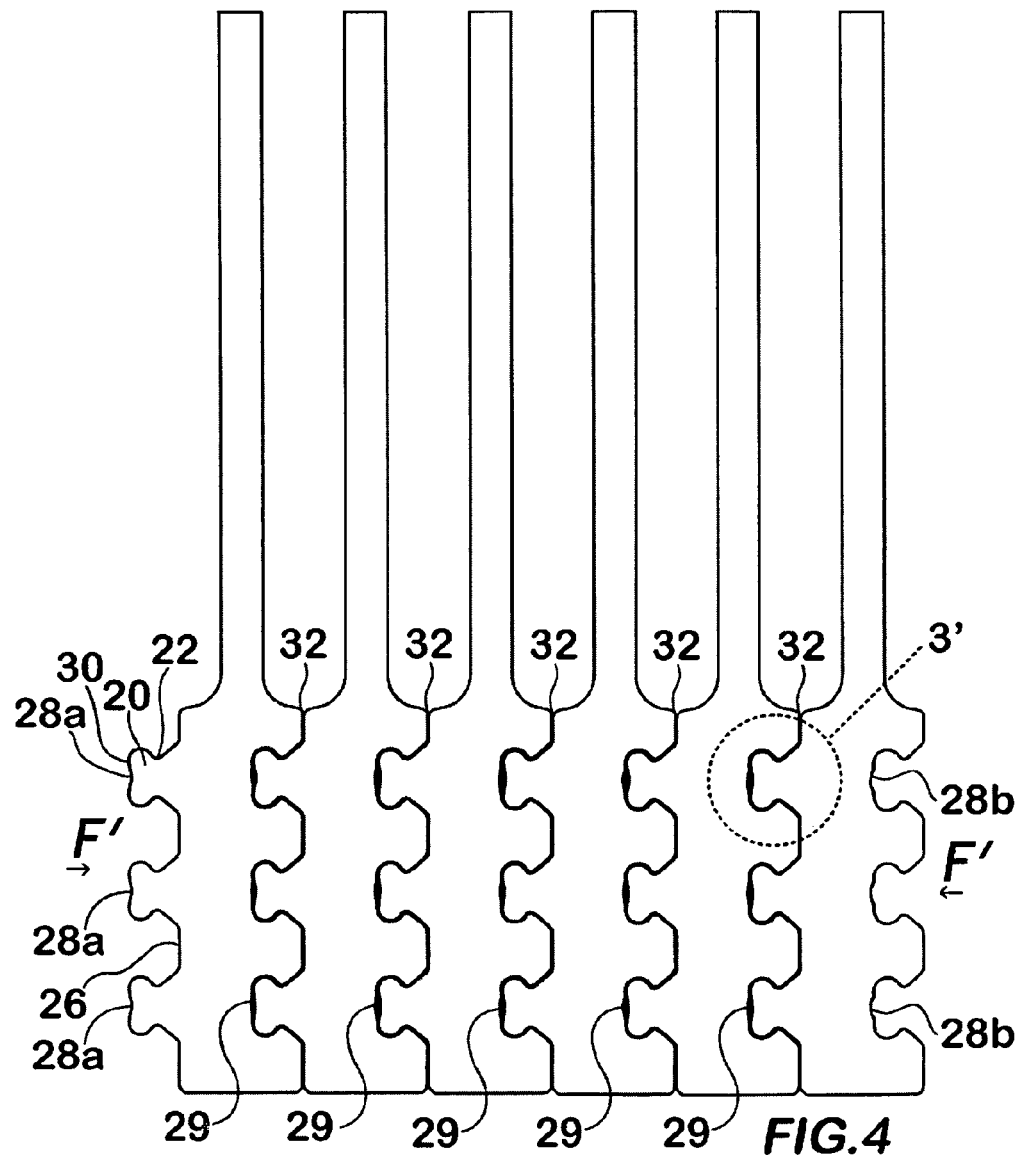
FIG. 4 is an end view according to one embodiment of the present invention depicting an assembly of multiple extruded members press-fitted together.
Figure 5:
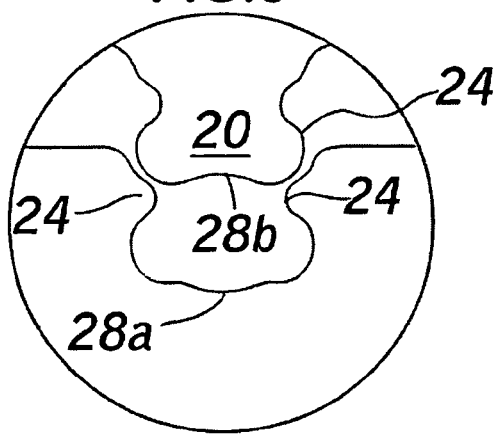
FIG. 5 is a detail view according to one embodiment of the present invention depicting the relative positions of a ridge of a one extruded member and a trough of another extruded member adjacent one another prior to press-fit.
Figure 6:
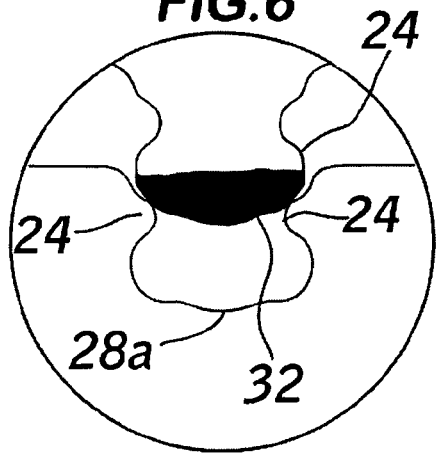
FIG. 6 is a detail view according to one embodiment of the present invention depicting the relative positions of a two extruded members prior to press-fit, with the top member shown having a head portion partially coated with a thermally conductive compound.
Figure 7:
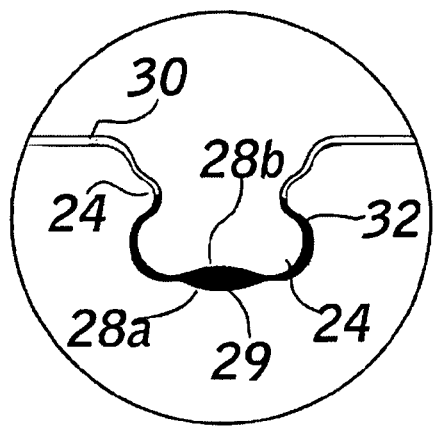
FIG. 7 is a detail view according to one embodiment of the present invention depicting a the progression of a head portion of a top extruded member, which has been forced past the knob portions 24 of the bottom extruded member into a trough in which the thermally conductive compound depicted in FIG. 6 is being progressively forced into the interstices.
Figure 8:
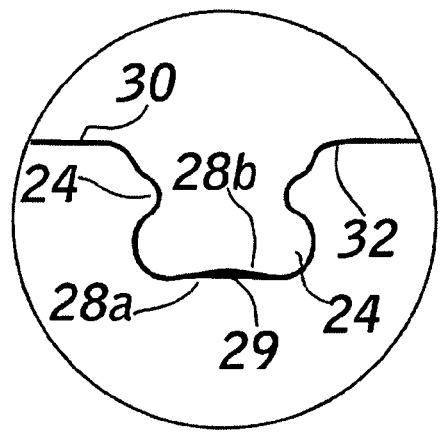
FIG. 8 is a detail view according to one embodiment of the present invention depicting a bulbous formation mated with a trough after press-fitting in which the (1) bulbous portions have been expandably deformed into the troughs, and (2) the thermally conductive has been forced into the surrounding interstices.

FIG. 3 is a cross-sectional view taken along lines 2'-2' of FIG. 2 and depicts the profiles of the various mate-able elements. The top portion 12a of the extruded member starts at a shoulder and then extends to a fin, in which the left and right side profiles of the shoulder are interconnected forming a curve between each fin in the assembly as shown in FIG. 4. Portions of the first face 12d of each extruded member are coated with or dipped into a thermally conductive compound 32 in order to partially cover certain ridges, in this case the grooved ridges, prior to a press-fit operation in which a transverse compressive force F' is applied evenly to each side of a grouping of adjacently arranged members 12 in order to first (1) force the ridges and troughs of the members together into an interlocking arrangement, and (2) further compressively deform the bulbous portions and troughs producing an interference fit. During the press-fitting, the grooves 28a, 28b which are axial to the applied compressive force are pressed together and deform, forcing additional compound 32 into the interstices between the mate-ably engaged members. As the deformation of the bulbous portions is expansive, i.e., having little shearing between the ridges and troughs, void formation within the thermal compound at the junctions between the ridges and troughs is prevented by an uninterrupted flow of compound from the grooves 28a, 28b with the result being a uniform and void-free distribution of compound within the interstices.

Section 3' of the assembly shown in FIG. 4 depicts a region of an extruded member where a ridge and trough mateably connected. For conciseness and clarity, FIGS. 5-8 illustrate the region shown in 3' during the successive stages of the press-fitting operation which are in order, (i) the relative positions of a head portion 20 of an upper positioned member 12 possessing a groove 28b opposite the groove 28a of a trough portion 26 of a lower positioned member 12 positioned adjacent on another prior to a press fit operation, and (ii) the head portion 20 of the upper member now partially coated via a dipping process with a thermally conductive compound such as a thermal epoxy, which fills longitudinal groove 28b, and (iii) the mating engagement between a ridge and trough in which the head portion 20 of the upper member has been forced past the adjacent knob portions 24 of a pair of non-grooved ridges and into a trough 26 of the lower member where further compression leads to expanding deformation forcing the thermal compound 32 out of the reservoir 29 formed by the facing grooves 28a, 28b and finally, (iv) in FIG. 8, we see the sinus-shaped reservoir 29 formed by the facing grooves 28a, 28b has diminished in volume, having released most of its contents to the adjacent interstices during the press-fitting.

Figure 9:
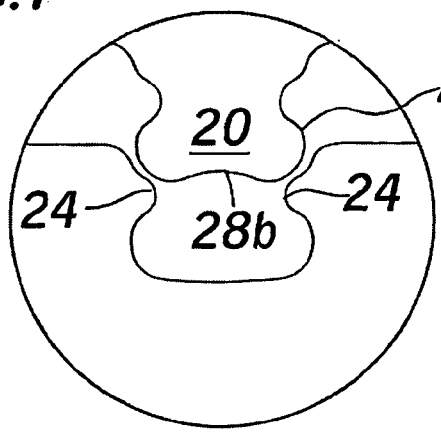
FIG. 9 is a detail view according to another embodiment of the present invention depicting the relative positions of a ridge of a one extruded member and a trough of another extruded member adjacent one another prior to press-fit.

While preferably the interconnected extruded members possess the same profile with some ridges and troughs having grooves which are alternating and interconnected in mirrored opposition forming reservoirs 29 which (after coating and prior to press-fitting) contain excess thermal compound resulting in superior flow of thermal compound to adjacent interstices, it is intended that a number of grooved regions which produce reservoirs when mated with non-grooved regions of an extruded member still fall within the scope of the invention. Although one non-limiting example of the latter is depicted in FIG. 9 which depicts a bottom extruded member with a non-grooved trough prior to mating with a top extruded member with a grooved ridge, a non-grooved ridge can be mated with a grooved trough to produce a reservoir. Relatedly, it is conceivable that the ridge portions having the grooves that form the reservoirs may be separated by relatively wider troughs than those shown in the figures, or relatively narrower troughs as the case may be, and that the bulbous portions may vary in size, distances apart, and possess more than, or less than two knobs on each head portion. Accordingly, while the invention has been described by the embodiments given, it is not intended to limit the scope of the invention to the particular form set forth, but on the contrary, it is intended to cover such alternatives, modifications, and equivalents as may be included within the spirit and scope of the invention as defined by the appended claims.

What is claimed is:

1. A method for producing a heat-sink assembly comprising the steps:
    i) producing a plurality of extruded members, each extruded member having length, width, a top portion, a middle portion, a bottom portion, a first face and a second face with the top portion extending to a fin, and the first and second faces having an alternating pattern of longitudinal ridges and troughs, in which the ridges are relatively bulbous shaped and possess a head portion and a neck portion transitioning to the trough, and at least some of the ridges and troughs possessing a groove that together with an adjacently mating extruded member form a reservoir for a thermally conductive compound; and,
    ii) coating at least a portion of at least one face of each extruded member with said thermally conductive compound; and,
    iii) press-fitting the extruded members together in which the bulbous shapes of each extruded member are forced initially past the bulbous shapes of adjacent mating extruded members to expandably deform when further compressed into inner surfaces of each trough; and,
    iv) further compression of the mated extruded members so the reservoirs feed the conductive compound to the mate-ably engaged surfaces adjacent the reservoirs.
2. The method of claim 1 in which the grooves of the ridges and troughs are facing one another once the extruded members are mate-ably engaged.

\* \* \* \* \*